US008724364B2

(12) United States Patent
Agam et al.

(10) Patent No.: US 8,724,364 B2
(45) Date of Patent: May 13, 2014

(54) ELECTRONIC DEVICE INCLUDING A NONVOLATILE MEMORY STRUCTURE HAVING AN ANTIFUSE COMPONENT AND A PROCESS OF USING THE SAME

(75) Inventors: Moshe Agam, Portland, OR (US); Thierry Coffi Herve Yao, Portland, OR (US); Shizen Skip Liu, Clackamas, OR (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 320 days.

(21) Appl. No.: 13/232,745

(22) Filed: Sep. 14, 2011

(65) Prior Publication Data

US 2013/0063999 A1    Mar. 14, 2013

(51) Int. Cl.
G11C 17/00    (2006.01)

(52) U.S. Cl.
USPC ............. 365/96; 365/103; 365/104; 365/105; 365/225.7

(58) Field of Classification Search
USPC .................... 365/96, 225.7, 104, 103, 105
See application file for complete search history.

(56) References Cited

U.S. PATENT DOCUMENTS

| | | | |
|---|---|---|---|
| 6,507,053 B1 | 1/2003 | Bernard et al. | |
| 6,927,997 B2 | 8/2005 | Lee et al. | |
| 7,046,569 B2 | 5/2006 | Ito et al. | |
| 7,102,951 B2 | 9/2006 | Paillet et al. | |
| 7,277,348 B2 | 10/2007 | Peng et al. | |
| 7,280,425 B2 | 10/2007 | Keshavarzi et al. | |
| 7,402,855 B2 | 7/2008 | Kurjanowicz | |
| 7,489,535 B2 | 2/2009 | Mallikararjunaswamy | |
| 7,511,982 B2 | 3/2009 | Kurjanowicz et al. | |
| 7,602,029 B2 | 10/2009 | Mallikararjunaswamy | |
| 7,613,913 B2 | 11/2009 | Haban et al. | |
| 7,764,532 B2 | 7/2010 | Kurjanowicz et al. | |
| 7,764,541 B2 | 7/2010 | Kohler et al. | |
| 8,259,518 B2* | 9/2012 | Peng et al. | 365/189.2 |
| 2011/0080765 A1* | 4/2011 | Groepl et al. | 365/96 |
| 2011/0249487 A1* | 10/2011 | Saito et al. | 365/149 |

FOREIGN PATENT DOCUMENTS

WO    2006121828 A2    11/2006

OTHER PUBLICATIONS

U.S. Appl. No. 13/232,487, filed Sep. 14, 2011, "Electronic Device Including a Nonvolatile Memory Structure Having an Antifuse Component and a Process of Forming the Same", Inventors: Moshe Agam et al.
U.S. Appl. No. 13/232,568, filed Sep. 14, 2011, "Electronic Device Including a Nonvolatile Memory Structure Having an Antifuse Component and a Process of Forming the Same", Inventors: Moshe Agam et al.

* cited by examiner

*Primary Examiner* — Toan Le
(74) *Attorney, Agent, or Firm* — Abel Law Group, LLP

(57) ABSTRACT

An electronic device can include a nonvolatile memory cell, wherein the nonvolatile memory cell can include an antifuse component, a switch, and a read transistor having a control electrode. Within the nonvolatile memory cell, the switch can be coupled to the antifuse component, and the control electrode of the read transistor can be coupled to the antifuse component. The nonvolatile memory cell can be programmed by flowing current through the antifuse component and the switch and bypassing the current away the read transistor. Thus, programming can be performed without flowing current through the read transistor decreasing the likelihood of the read transistor sustaining damage during programming. Further, the antifuse component may not be connected in series with the current electrodes of the read transistor, and thus, during read operations, read current differences between programmed and unprogrammed nonvolatile memory cells can be more readily determined.

18 Claims, 3 Drawing Sheets

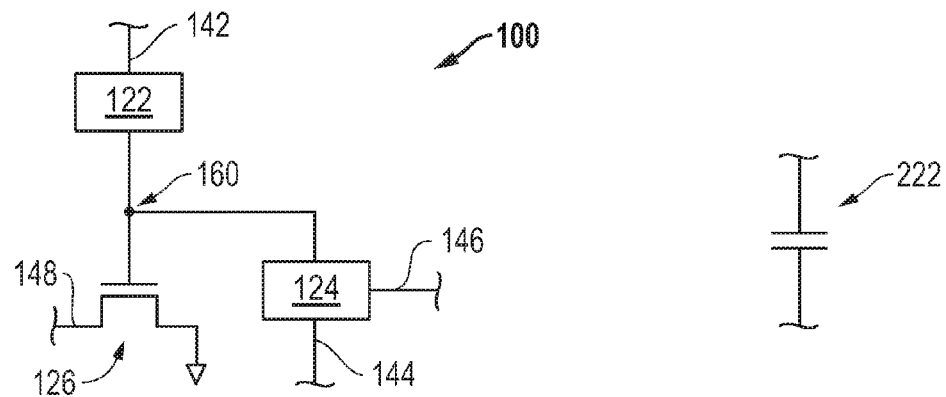
FIG. 1                    FIG. 2
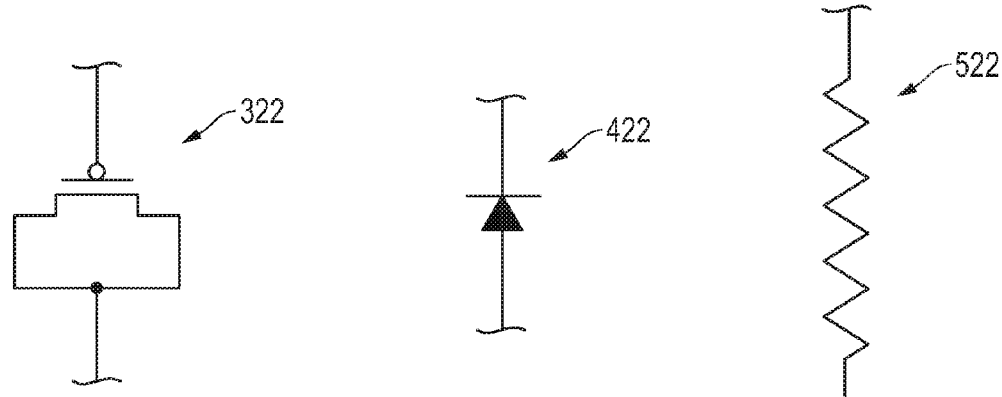
FIG. 3        FIG. 4
FIG. 5

ELECTRONIC DEVICE INCLUDING A NONVOLATILE MEMORY STRUCTURE HAVING AN ANTIFUSE COMPONENT AND A PROCESS OF USING THE SAME

FIELD OF THE DISCLOSURE

The present disclosure relates to electronic devices and processes of using electronic devices, and more particularly to, electronic devices including nonvolatile memory cells having antifuse components, and processes of using the same.

RELATED ART

Electronic devices can include nonvolatile memory cells. The nonvolatile memory cells include one-time programmable ("OTP") memory cells with an antifuse component. Before programming, the antifuse component is in an open or relatively high resistive state, and after programming, the antifuse component is in a relatively conductive state (as compared to before programming). In addition to the antifuse component, the nonvolatile memory call can include a read transistor, where a source region, a drain region, or a source/drain region of the read transistor is electrically connected to a terminal of the antifuse component. During programming and reading of the memory cell, current flows through the read transistor and antifuse component.

BRIEF DESCRIPTION OF THE DRAWINGS

Embodiments are illustrated by way of example and are not limited in the accompanying figures.

FIG. 1 includes a circuit diagram of a nonvolatile memory cell that includes an antifuse component, a switch, and a read transistor in accordance with an embodiment.

FIG. 2 includes a circuit representation of a capacitor that can be used for the antifuse component in a particular embodiment.

FIG. 3 includes a circuit representation of a transistor structure that can be used for the antifuse component in a particular embodiment.

FIG. 4 includes a circuit representation of a diode that can be used for the antifuse component in a particular embodiment.

FIG. 5 includes a circuit representation of a resistor that can be used for the antifuse component in a particular embodiment.

Figure 6:
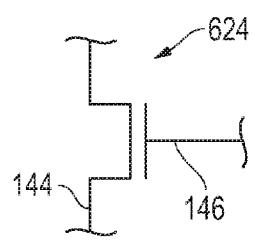
FIG. 6 includes a circuit representation of a transistor that can be used for the switch in a particular embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. While numerical ranges are described herein to provide a better understanding of particular embodiments, after reading this specification, skilled artisans will appreciate that values outside the numerical ranges may be used without departing from the scope of the present invention.

The term "coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be transferred from one to another. A non-limiting example of "coupled" can include a direct electrical connection between electronic component(s), circuit(s) or electronic component(s) or circuit(s) with switch(es) (for example, transistor(s)) connected between them. Thus, an electrical connection is a specific type of coupling; however, not all couplings are electrical connections.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a nonvolatile memory ("NVM") cell, wherein the NVM cell can include an antifuse component, a switch, and a read transistor having a control electrode. In a particular embodiment, the NVM cell can be an OTP cell. Within the NVM cell, the control electrode of the read transistor can be coupled to the antifuse component and the switch. The NVM cell can be programmed by flowing current through the antifuse component and the switch and bypassing the current around the read transistor. In particular, no significant current flows through the drain region, the channel region, and the source region of the read transistor during programming. Thus, the read transistor does not sustain damage during programming. Further, the antifuse component is not connected in series with the read transistor. After reading this specification, skilled artisans will appreciate that a programmed antifuse component will still have a significant resistance. In a conventional circuit having the antifuse component connected in series with the current flow through the read transistor, the antifuse component reduces the current flow, and therefore, determining whether the conventional NVM cell is or is not programmed may be more difficult. For the NVM cells as illustrated and described, the antifuse component is not connected in series with the current flow through the read transistor. Accordingly, the extra impedance associated with the conventional NVM cells is obviated, as the antifuse components in the NVM cells as illustrated and described herein, are not within the current paths to the bit lines. Accordingly, read current differences between programmed and unprogrammed NVM cells can be more readily determined.

FIG. 1 includes a circuit diagram of a NVM cell 100 that includes an antifuse component 122, a switch 124, and a read transistor 126 in accordance with an embodiment. The NVM cell 100 can be part of a memory array or may be an individual memory cell outside of a memory array. In a particular embodiment, the antifuse component 122 has a pair of terminals, the switch 124 has a pair of current terminals and a control terminal, and the read transistor 126 has a pair of current terminals and a control electrode. In the embodiment as illustrated, the antifuse component 122 is coupled to a word line 142 or to a terminal that provides a control signal towards the control electrode of the read transistor 126 during a read operation. The other terminal of the antifuse component 122 is coupled to a current terminal of the switch 124 and the control electrode of the read transistor 126. The other current terminal of the switch 124 is coupled to a program line 144 or to a $V_{SS}$ terminal or a ground terminal. The control terminal of the switch 124 is coupled to an access line 146 or a terminal that controls when a programming current flows through the antifuse component 122. One of the current terminals of the read transistor 126 is coupled to a bit line or a terminal coupled to an amplifier or another circuit used in determining the programming state (programmed or unprogrammed) of the NVM cell 100. The other current terminal of the read transistor 126 is coupled to a ground terminal or a $V_{SS}$ terminal.

In a particular embodiment, any one or more of the couplings can be replaced by one or more electrical connections. One of the terminals of the antifuse component 122 is electrically to the word line 142 or to a terminal that provides a control signal towards the control electrode of the read transistor 126 during a read operation. The other terminal of the antifuse component 122 the current terminal of the switch 124, and the control electrode of the read transistor 126 can be electrically connected at a node 160. The other current terminal of the switch 124 can be electrically connected to the program line 144 or to the $V_{SS}$ terminal or the ground terminal. The control terminal of the switch 124 can be electrically connected to the access line 146 or the terminal that controls when the programming current flows through the antifuse component 122. One of the current terminals of the read transistor 126 can be electrically connected to the bit line 148 or the terminal coupled to the amplifier or the other circuit used in determining the programming state (programmed or unprogrammed) of the NVM cell 100. The other current terminal of the read transistor 126 can be electrically connected to the ground terminal or the $V_{SS}$ terminal.

In another embodiment (not illustrated), another component may be part of the NVM cell 100. In a particular embodiment, another switch may be used to protect better the read transistor 126 during a programming operation. A current terminal of the other switch can be coupled to a terminal of the antifuse component 122 and a current terminal of the switch 124, and the other current terminal of the other switch can be coupled to the control electrode of the read transistor 126. A control terminal of the other switch can be coupled to another terminal that is used to provide a control signal to the other switch. In a particular embodiment, the other switch can have a current terminal electrically connected to the node 160 and the other terminal is electrically connected to the gate electrode of the read transistor 126. During a read operation of the NVM cell 100, the other switch can be on, and during a program operation of the NVM cell 100, the other switch can be off.

The antifuse component 122 can be a capacitor 222, as illustrated in FIG. 2. The capacitor 222 can include a pair of conductive electrodes spaced apart by a dielectric layer. In another embodiment, the capacitor 222 can have a more complex form, such as a transistor structure. Referring to FIG. 3, the antifuse component 122 can include a transistor structure 322. As illustrated, the transistor structure 322 is a p-channel transistor. In another embodiment, the transistor structure can be an n-channel transistor. In the transistor structure 322, the source and drain regions are electrically connected to each other. The active region of the transistor structure 322 may be within a body region, such as a well region or a portion of the substrate, and the body region can be electrically connected to the source and drain regions of the transistor structure 322. The gate electrode of the transistor structure 322 can be coupled to the word line 142, and the source and drain regions of the transistor structure 322 can be coupled to the control electrode of the read transistor 126. Alternatively, the source and drain regions of the transistor structure 322 can be coupled to the word line 142, and the gate electrode of the transistor structure can be coupled to the control electrode of the read transistor 126.

The antifuse component 122 can be a diode 422, as illustrated in FIG. 4. The cathode of the diode 422 can be coupled to the word line 142, and the anode of the diode 422 can be coupled to the control electrode of the read transistor 126. In another embodiment, the antifuse component 122 can be a resistor 522, as illustrated in FIG. 5.

Similar to the antifuse component 122, the switch 124 can be implemented in different forms. The switch 124 can be a transistor, such as a field-effect transistor or a bipolar transistor. In a particular embodiment, the switch 124 is an n-channel transistor 624, as illustrated in FIG. 6. The drain region of the n-channel transistor 624 is coupled to a terminal of the antifuse component 122, the source region is coupled to the program line 144, and the gate electrode is coupled to the access line 146. In another embodiment, a p-channel transistor may be used instead of the n-channel transistor 624. For the p-channel transistor, the source region is coupled to a terminal of the antifuse component 122, the drain region is coupled to the program line 144, and the gate electrode is coupled to the access line 146.

In another particular embodiment, the switch 124 can include a transmission gate 724 that includes an n-channel transistor 742 and a p-channel transistor 744. The drain region of the n-channel transistor 742 and the source region of the p-channel transistor 744 are electrically connected at a node 746, and the source region of the n-channel transistor 742 and the drain region of the p-channel transistor 744 are electrically connected at a node 748. The node 746 is coupled to the antifuse component 122, and the node 748 is coupled to the program line 144. In the embodiment as illustrated, the gate electrode of the p-channel transistor 744 is coupled to an output of an inverter 764. The gate electrode of the n-channel transistor 742 and an input of the inverter 764 are electrically connected to each other at a node 784 that is coupled to the access line 146. In another embodiment, the inverter 764 is not present within the switch 124, and the gate electrodes of the transistors 742 and 744 are controlled by different lines. Thus, two access lines that are configured to provide complementary signals can be used in place of the access line 142.

In a further particular embodiment, the switch 124 can include one or more other components that may be used in placed of or in conjunction with the components previously described. For example, the switch can include an npn transistor, a pnp transistor, or another suitable component.

In the embodiment as illustrated, the read transistor 126 includes an n-channel transistor having a drain region coupled to the bit line 148, a source region coupled to a ground terminal or a $V_{SS}$ terminal, and a gate electrode coupled to the antifuse component 122. In another embodiment, a p-channel transistor can be used in place of or in addition to the n-channel transistor. The p-channel transistor has a source region coupled to the bit line 148, a drain region coupled to a ground terminal or a $V_{SS}$ terminal, and a gate electrode coupled to the antifuse component 122. In a further embodiment, the read transistor can include a bipolar transistor, such as an npn transistor or a pnp transistor. For an npn transistor, a collector region is coupled to the bit line 148, an emitter region coupled to a ground terminal or a $V_{SS}$ terminal, and a base region is coupled to the antifuse component 122, and for a pnp transistor, an emitter region is coupled to the bit line 148, a collector region coupled to a ground terminal or a $V_{SS}$ terminal, and a base region is coupled to the antifuse component 122. Thus, as used in this specification, a control electrode of a transistor is to be construed broadly and can include a gate electrode or a base region, and a current terminal of a transistor is to be construed broadly and can include a source region, a drain region, an emitter region or a collector region.

Referring to FIG. 1, the NVM cell 100 can be programmed when the NVM cell is properly biased. The voltage difference between the word line 142 and the program line 144 can be a programming voltage, $V_{PP}$. In an embodiment, the word line 142 can be at approximately $V_{PP}$, and the program line 144 can be at approximately 0 volts. In another embodiment, the word line 142 can be at approximately $+\frac{1}{2} V_{PP}$, and the program line 144 can be at approximately $-\frac{1}{2} V_{PP}$.

Figure 7:
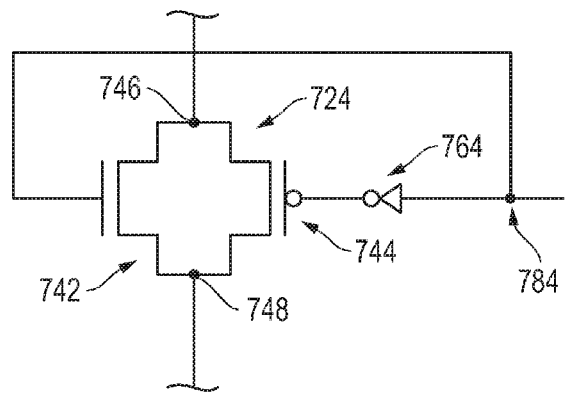
FIG. 7 includes a circuit representation of a transmission gate that can be used for the switch in a particular embodiment.

The switch 124 is on during programming, and thus, a signal provided on the access line 146 to the control terminal of the switch is sufficient to turn on the switch 142. In a particular embodiment, the control terminal of the switch 142 is at approximately $V_{DD}$ when on, and at approximately 0 volts when off. Other voltages for turning on and off the switch 124 can be used and may depend on the particular configuration of components within the switch 124. Referring to FIG. 7, if the inverter 764 would be placed between the gate electrode of the n-channel transistor 742 and the node 784, instead of between the gate electrode of the p-channel transistor 744 and the node 784, then the control terminal of the switch 142 is at approximately 0 volts when on, and at approximately $V_{DD}$ when off.

During programming, the bit line 148 is at approximately ground or 0 volts. Substantially no current flows through the read transistor 126 during a programming operation because the source and drain regions of the transistor 126 are at substantially the same voltage.

When the NVM cell 100 is programmed, the antifuse component 122 is changed to a state that more similar to a resistor. With respect to the capacitor 222, including the transistor structure 322, the dielectric layer no longer substantially prevents current from flowing between the electrodes. With respect to the transistor structure 322, significant current can flow through the gate dielectric layer, such as between the gate electrode and the source and drain regions of the transistor structure 322. With respect to the diode 422, the current under reverse biasing becomes substantially higher during a read operation, as compared to the NVM cell 100 when in an unprogrammed state. With respect to the resistor 522, the resistance becomes substantially lower when in a programmed state as compared to an unprogrammed state.

Note that within the NVM cell 100, during programming, the current flows through the antifuse component 122 and the switch 124. The current path with the switch 124 allows the programming current to bypass the read transistor 126, and thus, damage to the read transistor 126 during programming is substantially reduced. Compare the NVM cell 100 to a conventional NMV cell having an antifuse component and a read transistor electrically connected in series. During a programming operation of an array of conventional NVM cells, the gate dielectric layer of a selected cell, an unselected cell or a combination of selected and unselected cells may be exposed to relatively high voltages while current is flowing through the read transistor. Such a condition may cause charge to become trapped or cause another gate dielectric degradation mechanism to occur within the read transistor. Thus, one or more conventional NVM cells within the array may fail during programming or have significantly reduced expected lifetime (as measured by the number of programming operations, read operations, or a combination of programming and read operations).

During a read operation of the NVM cell 100, the word line 142 and the bit line 148 are at approximately $V_{DD}$, and the program line 144 and access line 146 are at approximately 0 volts. In another embodiment, different voltages may be used. For example, the word line 142 may be at a higher voltage as compared to the bit line 148. Further, the program line 142 may be at substantially the same voltage as compared to the word line 142, to reduce leakage current through the switch 124, as the switch 124 is in an off state during a read operation.

Figure 8:
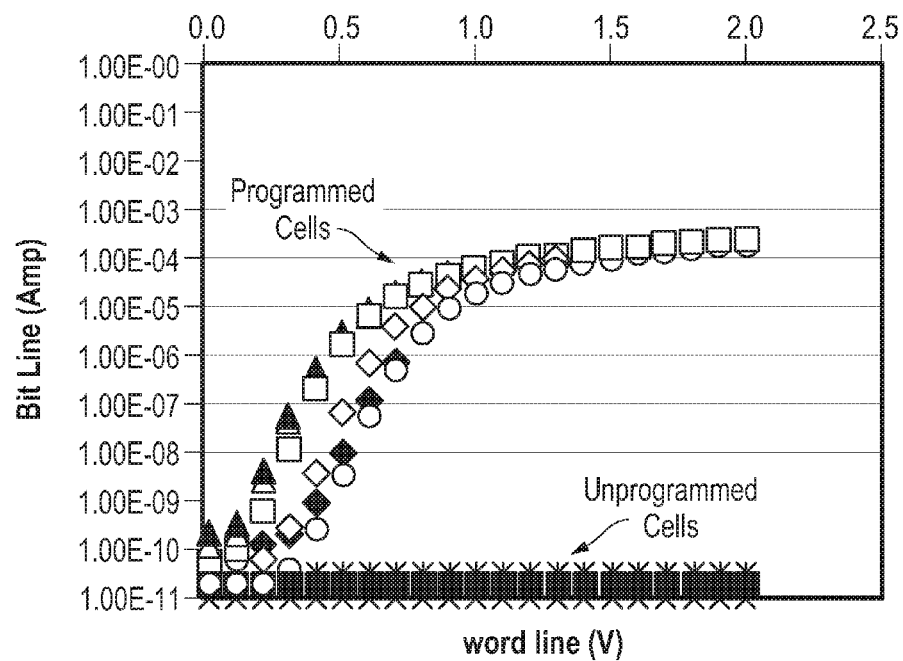
FIG. 8 includes a plot of bit line current as a function of word line voltage for programmed and unprogrammed cells.

When the NVM cell 100 is programmed, significant current can be detected at the bit line 148, and when the NVM cell is unprogrammed, substantially lower or no significant current is detected at the bit line 148. FIG. 8 includes the I-V characteristics of read transistors for programmed and unprogrammed NVM cells in accordance with an embodiment as described herein. The programmed NVM cells have a significant drain current at word line voltages of approximately 0.5 V and higher. $I_{dsat}$ for the programmed NVM cells is greater than $10^{-4}$ amperes, whereas $I_d$ for the unprogrammed NMV cells is less than $10^{-10}$ amperes. The particular I-V characteristics may not exactly match those as illustrated in FIG. 8; however, a binary distribution of I-V characteristics will occur between the programmed and unprogrammed NVM cells.

Figure 9:
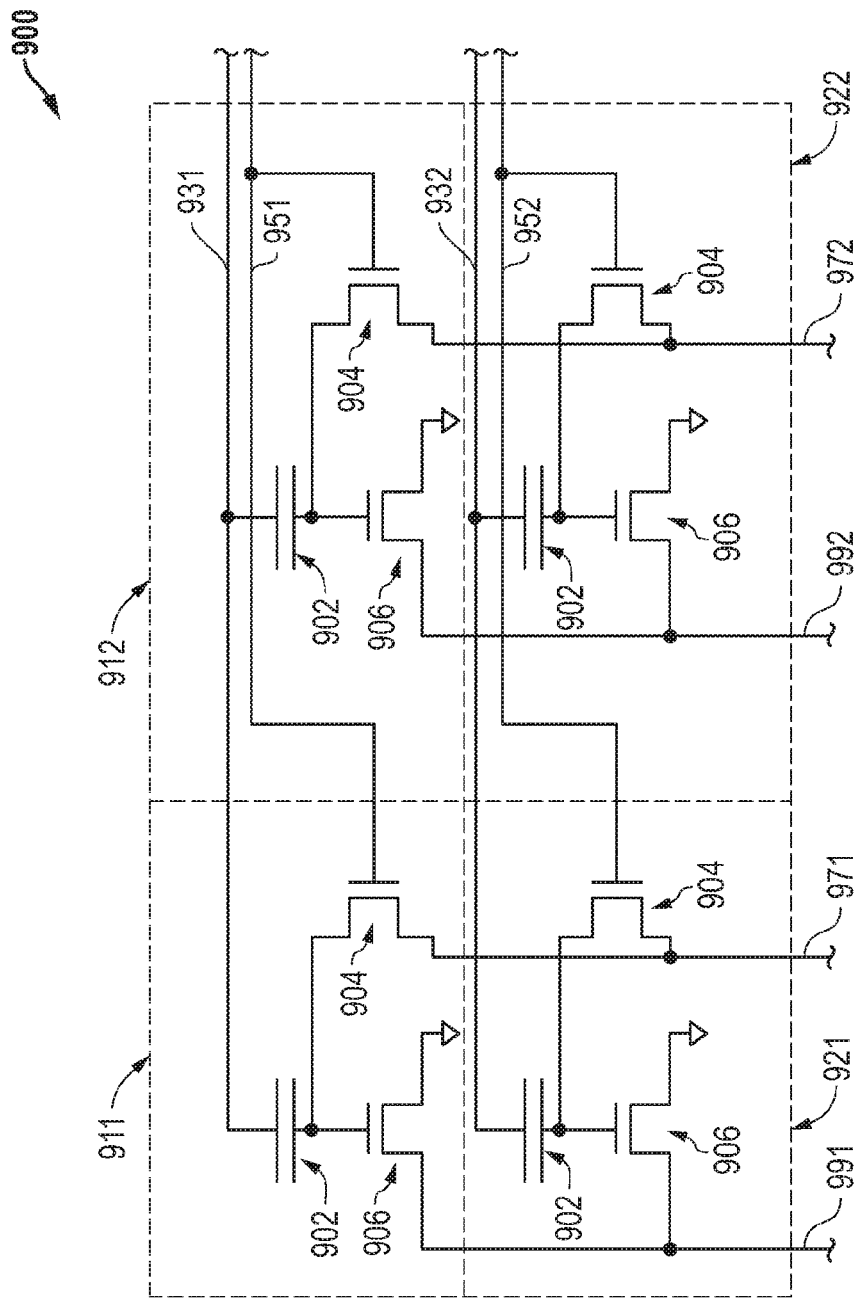
FIG. 9 includes a circuit diagram of a portion of an array including nonvolatile memory cells.

FIG. 9 includes a schematic diagram of a portion of an NVM array 90. In a particular embodiment, the NVM array may be used in an integrated circuit. The NVM array 90 includes four NVM cells 911, 912, 921, and 922 that are arranged in rows and columns. In the particular embodiment as illustrated in FIG. 9, each of the NVM cells includes an antifuse component in the form of a capacitor 902, a switch in the form of an n-channel transistor 904, and a read transistor 906. The couplings and electrical connections are substantially the same as described with respect to FIG. 1. In the NVM array 90, an electrode of each of the capacitors 902 of NVM cells 911 and 912 is coupled to a word line ("WL") 931, and an electrode of each of the capacitors 902 of NVM cells 921 and 922 is coupled to a WL 932. Gate electrodes of the n-channel transistors 904 of NVM cells 911 and 912 are coupled to an access line ("AL") 951, and gate electrodes of the n-channel transistors 904 of NVM cells 921 and 922 are coupled to an AL 952. Source regions of the n-channel transistors 904 of NVM cells 911 and 921 are coupled to a program line ("PL") 971, and source regions of the n-channel transistors 904 of NVM cells 921 and 922 are coupled to a PL 672. Drain regions of the read transistors 906 of NVM cells 911 and 921 are coupled to a bit line ("BL") 991, and drain regions of the read transistors 906 of NVM cells 921 and 922 are coupled to a BL 992. The source regions of the read transistors 911, 912, 921, and 922 are coupled to ground. In a more particular embodiment, each of the previously described couplings can be the form of electrical connections.

Table 1 includes voltages used for programming using the NVM array 90. In Table 1, $V_{DD}^*$ is a voltage between $V_{DD}$ and $V_{PP}$. In an embodiment, $V_{DD}^*$ is closer to $V_{DD}$ than to $V_{PP}$. In a particular embodiment, when $V_{DD}$ is approximately 1.8 V, and $V_{PP}$ is approximately 8 V, $V_{DD}^*$ is approximately 2.5V. After reading this specification, skilled artisans will appreciate that the actual voltages used for program operations can depend on the design rules and other parameters used for the NVM array 90. Other voltages may be used without departing from the concepts as described herein.

TABLE 1

| | Program | | | |
|---|---|---|---|---|
| | BL | PL | AL | WL |
| Selected cell | 0 | 0 | $V_{DD}$ | $V_{PP}$ |
| Selected column/unselected row | 0 | 0 | 0 | 0 |
| Selected row/unselected column | 0 | $V_{DD}^*$ | $V_{DD}$ | $V_{PP}$ |
| Unselected column/unselected row | 0 | $V_{DD}^*$ | 0 | 0 |

In an embodiment, the NVM cell 911 can be the selected cell that is programmed. The NVM cell 921 (selected column/unselected row) is not programmed because AL 952 is at 0 volts, and thus the switch, n-channel transistor 904, of the NVM cell 921 is off. Accordingly, a significant current does not flow through the antifuse component of the NVM cell 921. The NVM cell 912 (selected row/unselected column) will not be programmed because PL 972 is at $V_{DD}^*$, which provides a low enough current through the antifuse component, the capacitor 902, so that the antifuse component will not be programmed. Similar to NVM cell 921, the NVM cell 922 (unselected column/unselected row) is not programmed because AL 952 is at 0 volts, and thus the switch, n-channel transistor 904, of the NVM cell 922 is off. Accordingly, a significant current does not flow through the antifuse component of the NVM cell 922. Hence, the NVM cell 911 can be programmed without causing a program disturb of NVM cells 912, 921, and 922.

Table 2 includes voltages used for reading using the NVM array 90. In a particular embodiment, when $V_{DD}$ is approximately 1.8 V. Similar to the programming voltages, after reading this specification, skilled artisans will appreciate that the actual voltages used for read operations can depend on the design rules and other parameters used for the NVM array 90. Other voltages may be used without departing from the concepts as described herein.

TABLE 2

| | Read | | | |
|---|---|---|---|---|
| | BL | PL | AL | WL |
| Selected cell | $V_{DD}$ | 0 | 0 | $V_{DD}$ |
| Selected column/unselected row | $V_{DD}$ | 0 | $V_{DD}$ | 0 |
| Selected row/unselected column | 0 | 0 | 0 | $V_{DD}$ |
| Unselected column/unselected row | 0 | 0 | $V_{DD}$ | 0 |

In an embodiment, the NVM cell 911 can be the selected cell that is read. The NVM cell 921 (selected column/unselected row) is not read because WL 932 is at 0 volts. The NVM cell 912 (selected row/unselected cell) will not be read because BL 972 is at 0 V, and thus, the source and drain regions of the read transistor 906 of the NVM cell 912 are at approximately the same voltage. Similar to NVM cell 921, the NVM cell 922 (unselected column/unselected row) is not read because WL 932 is at 0 volts.

Many different physical designs may be used in implementing the circuits as shown and described. Non-limiting particular physical designs and processes of making integrated circuits with the NVM cells are illustrated and described in U.S. application Ser. Nos. 13/232,487 and 13/232,568, which are filed of even date and incorporated by reference in their entireties.

The NVM cell as illustrated and described herein can allow for a relative compact memory cell. Because the current flow during programming bypasses the read transistor, the read transistor is less likely to have charge become trapped within the gate dielectric layer of the read transistor or cause another gate dielectric degradation mechanism to occur within the read transistor. Thus, the NVM cells as described herein is significantly less likely to fail during programming or have significantly reduced expected lifetime (as measured by the number of programming operations, read operations, or a combination of programming and read operations). When the NVM cells are implemented in an array, program and read conditions can be selected such that unselected cells are not significantly disturbed.

After reading this specification, skilled artisans will appreciate the flexibility in implementing different layouts, processing flows, operating techniques (program, erase, read), or any combination thereof that allow the NVM memory cell array to be tailored to a particular application. Thus, the NVM memory cell array can be integrated into an existing logic process flow, using existing program, erase, and read units for NVM memories with no or only some changes.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device includes a nonvolatile memory cell. The nonvolatile memory cell can includes an antifuse component, a switch coupled to the antifuse component, and a read transistor having a control electrode, wherein the control electrode of the read transistor is coupled to the antifuse component.

In an embodiment of the first aspect, the antifuse component includes a capacitor, a diode, or a resistor. In a particular embodiment, the capacitor includes a transistor structure. In a more particular embodiment, the read transistor includes an n-channel transistor, and the transistor structure includes a p-channel transistor. In another embodiment, the switch includes a transistor. In a particular embodiment, the transistor includes an n-channel transistor.

In a further embodiment, the first terminal of the antifuse component is coupled to a first word line, the control electrode of the switch is coupled to a first access line, the second current electrode of the switch is coupled to a first program line or a ground terminal, the first current terminal of the read transistor is coupled to a first bit line, and the second current terminal of the read transistor is coupled to a $V_{SS}$ terminal or the ground terminal. In another further embodiment, the antifuse component has a first terminal and a second terminal, the switch has a first current terminal, a second current terminal, and a control terminal, and the control electrode of the read transistor is coupled to the second terminal of the antifuse component and the first current terminal of the switch. In a particular embodiment, the control electrode of the read transistor, the second terminal of the antifuse component, and the first current terminal of the switch are electrically connected to one another.

In a second aspect, an electronic device can include a first nonvolatile member cell, a second nonvolatile memory cell, a third nonvolatile memory cell, and a fourth nonvolatile memory cell. Each of the first nonvolatile memory cell, the second nonvolatile memory cell, and the third nonvolatile memory cell, and the fourth nonvolatile member cell can include an antifuse component having a first terminal and a second terminal; a switch having a first current terminal, a second current terminal, and a control terminal, wherein the first current terminal of the switch is coupled to the second terminal of the antifuse component; and a read transistor having a first current terminal, a second current terminal, and a control electrode, wherein the control electrode of the read transistor is coupled to the second terminal of the antifuse component. The first terminals of the antifuse components of the first and second nonvolatile memory cells can be coupled to a first word line, and the first terminals of the antifuse components of the third and fourth nonvolatile memory cells can be coupled to a second word line. The control terminals of the switches of the first and second nonvolatile memory cells can be coupled to a first access line, and the control terminals of switches of the third and fourth nonvolatile memory cells can be coupled to a second access line, the second current terminals of the switches of the first and third nonvolatile memory cells can be coupled to a first program line, and the second current terminals of the switches of the second and fourth nonvolatile memory cells can be coupled to a second program line. The first current terminals of the read transistors of the first and third nonvolatile memory cells can be coupled to a first bit line, and the first current terminals of the read transistors of the second and fourth nonvolatile memory cells can be coupled to a second bit line. The second current terminals of the first, second, third, and fourth nonvolatile memory cells can be coupled to a $V_{SS}$ terminal or the ground terminal.

In an embodiment of the second aspect, within each of the first, second, third, and fourth nonvolatile memory cells, the control electrode of the read transistor, the second terminal of the antifuse component, and the first current terminal of the switch are electrically connected to one another, the first terminals of the antifuse components of the first and second nonvolatile memory cells are electrically connected to the first word line, and the first terminals of the antifuse components of the third and fourth nonvolatile memory cells are electrically connected to the second word line. The control terminals of the switches of the first and second nonvolatile memory cells are electrically connected to the first access line, and the control terminals of switches of the third and fourth nonvolatile memory cells are electrically connected to the second access line. The second current terminals of the switches of the first and third nonvolatile memory cells are electrically connected to the first program line, and the second current terminals of the switches of the second and fourth nonvolatile memory cells are electrically connected to the second program line. The first current terminals of the read transistors of the first and third nonvolatile memory cells are electrically connected to the first bit line, and the first current terminals of the read transistors of the second and fourth nonvolatile memory cells are electrically connected to the second bit line. The second current terminals of the first, second, third, and fourth nonvolatile memory cells is electrically connected to a $V_{SS}$ terminal or the ground terminal.

In another embodiment of the second aspect, the antifuse component includes a transistor structure. In a particular embodiment, the read transistor includes an n-channel transistor, and the transistor structure includes a p-channel transistor. In still another embodiment, the switch includes a transistor. In a particular embodiment, the transistor includes an n-channel transistor.

In a third aspect, a method of using an electronic device including a first nonvolatile memory cell can include providing the first nonvolatile memory cell including an antifuse component, a switch, and a read transistor, wherein a gate electrode of the read transistor is coupled to the antifuse component and the switch, and programming the first nonvolatile memory cell by flowing current through the antifuse component and the switch and bypassing the current away from the read transistor.

In an embodiment of the third aspect, the method further includes a second nonvolatile member cell, a third nonvolatile memory cell, and a fourth nonvolatile memory cell, wherein each of the second, third, and fourth nonvolatile memory cells includes an antifuse component, a switch, and a read transistor, wherein a gate electrode of the read transistor is coupled to the antifuse component and the switch. Terminals of the antifuse components of the first and second nonvolatile memory cells are coupled to a first word line, terminals of the antifuse components of the third and fourth nonvolatile memory cells are coupled to a second word line, control terminals of the switches of the first and second nonvolatile memory cells are coupled to a first access line, and control terminals of switches of the third and fourth nonvolatile memory cells are coupled to a second access line. Current terminals of the switches of the first and third nonvolatile memory cells are coupled to a first program line, current terminals of the switches of the second and fourth nonvolatile memory cells are coupled to a second program line, current terminals of the read transistors of the first and third nonvolatile memory cells are coupled to a first bit line; current terminals of the read transistors of the second and fourth nonvolatile memory cells are coupled to a second bit line, and current terminals of the first, second, third, and fourth nonvolatile memory cells are coupled to a $V_{SS}$ terminal or the ground terminal. The method further includes programming the first nonvolatile memory cell is performed without significantly causing a program disturb with the second, third, and fourth nonvolatile memory cells.

In a particular embodiment of the third aspect, during programming a first voltage difference between the first word line and the second word line is a programming voltage. In a more particular embodiment, during programming, a second voltage difference between the second program line and the first program line is less than the programming voltage and is greater than a third voltage difference between the first program line and the first bit line or the second bit line. In another more particular embodiment, during programming, a second voltage difference between the first access line and the second access line is approximately $V_{DD}$.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device including a nonvolatile memory cell, wherein the nonvolatile memory cell comprises:
    an antifuse component;
    a switch coupled to the antifuse component; and
    a read transistor having a control electrode and a source region, wherein the control electrode of the read transistor is coupled to the antifuse component, and wherein the source region is coupled to a ground terminal.

2. The electronic device of claim 1, wherein the antifuse component comprises a capacitor, a diode, or a resistor.

3. The electronic device of claim 2, wherein the capacitor comprises a transistor structure.

4. The electronic device of claim 3, wherein the read transistor comprises an n-channel transistor, and the transistor structure comprises a p-channel transistor.

5. The electronic device of claim 1, wherein the switch comprises a transistor.

6. The electronic device of claim 5, wherein the transistor comprises an n-channel transistor.

7. The electronic device of claim 1, wherein:
    a first terminal of the antifuse component is coupled to a first word line;
    a control electrode of the switch is coupled to a first access line;
    a second current electrode of the switch is coupled to a first program line or a ground terminal; and
    a drain region of the read transistor is coupled to a first bit line.

8. The electronic device of claim 1, wherein:
    the antifuse component has a first terminal and a second terminal;
    the switch has a first current terminal, a second current terminal, and a control terminal; and
    the control electrode of the read transistor is coupled to the second terminal of the antifuse component and the first current terminal of the switch.

9. The electronic device of claim 8, wherein the control electrode of the read transistor, the second terminal of the antifuse component, and the first current terminal of the switch are electrically connected to one another.

10. An electronic device comprising a first nonvolatile memory cell, a second nonvolatile memory cell, a third nonvolatile memory cell, and a fourth nonvolatile memory cell, wherein:
    each of the first nonvolatile memory cell, the second nonvolatile memory cell, and the third nonvolatile memory cell, and the fourth nonvolatile member cell comprises:
        an antifuse component having a first terminal and a second terminal;
        a switch having a first current terminal, a second current terminal, and a control terminal, wherein the first current terminal of the switch is coupled to the second terminal of the antifuse component; and
        a read transistor having a first current terminal, a second current terminal, and a control electrode, wherein the control electrode of the read transistor is coupled to the second terminal of the antifuse component;
    the first terminals of the antifuse components of the first and second nonvolatile memory cells are coupled to a first word line;
    the first terminals of the antifuse components of the third and fourth nonvolatile memory cells are coupled to a second word line;
    the control terminals of the switches of the first and second nonvolatile memory cells are coupled to a first access line;
    the control terminals of switches of the third and fourth nonvolatile memory cells are coupled to a second access line;
    the second current terminals of the switches of the first and third nonvolatile memory cells are coupled to a first program line;
    the second current terminals of the switches of the second and fourth nonvolatile memory cells are coupled to a second program line;
    the first current terminals of the read transistors of the first and third nonvolatile memory cells are coupled to a first bit line;
    the first current terminals of the read transistors of the second and fourth nonvolatile memory cells are coupled to a second bit line; and
    the second current terminals of the first, second, third, and fourth nonvolatile memory cells are coupled to a $V_{SS}$ terminal or a ground terminal;
    within each of the first, second, third, and fourth nonvolatile memory cells, the control electrode of the read transistor, the second terminal of the antifuse component, and the first current terminal of the switch are electrically connected to one another;
    the first terminals of the antifuse components of the first and second nonvolatile memory cells are electrically connected to the first word line;
    the first terminals of the antifuse components of the third and fourth nonvolatile memory cells are electrically connected to the second word line;
    the control terminals of the switches of the first and second nonvolatile memory cells are electrically connected to the first access line;

the control terminals of switches of the third and fourth nonvolatile memory cells are electrically connected to the second access line;

the second current terminals of the switches of the first and third nonvolatile memory cells are electrically connected to the first program line;

the second current terminals of the switches of the second and fourth nonvolatile memory cells are electrically connected to the second program line;

the first current terminals of the read transistors of the first and third nonvolatile memory cells are electrically connected to the first bit line;

the first current terminals of the read transistors of the second and fourth nonvolatile memory cells are electrically connected to the second bit line; and the second current terminals of the first, second, third, and fourth nonvolatile memory cells is electrically connected to a $V_{SS}$ terminal or the ground terminal.

11. The electronic device of claim 10, wherein the antifuse component comprises a transistor structure.

12. The electronic device of claim 11, wherein the read transistor comprises an n-channel transistor, and the transistor structure comprises a p-channel transistor.

13. The electronic device of claim 10, wherein the switch comprises a transistor.

14. The electronic device of claim 13, wherein the transistor comprises an n-channel transistor.

15. A method of using an electronic device comprising a first nonvolatile memory cell comprising providing the first nonvolatile memory cell comprising an antifuse component, a switch, and a read transistor having a gate electrode, a source region, and a drain region, wherein the gate electrode of the read transistor is coupled to the antifuse component and the switch, and wherein the source region is coupled to a ground terminal;

providing a second nonvolatile memory cell, a third nonvolatile memory cell, and a fourth nonvolatile memory cell, wherein:

each of the second, third, and fourth nonvolatile memory cells comprises an antifuse component, a switch, and a read transistor, wherein a gate electrode of the read transistor is coupled to the antifuse component and the switch;

terminals of the antifuse components of the first and second nonvolatile memory cells are coupled to a first word line;

terminals of the antifuse components of the third and fourth nonvolatile memory cells are coupled to a second word line;

control terminals of the switches of the first and second nonvolatile memory cells are coupled to a first access line;

control terminals of switches of the third and fourth nonvolatile memory cells are coupled to a second access line;

current terminals of the switches of the first and third nonvolatile memory cells are coupled to a first program line;

current terminals of the switches of the second and fourth nonvolatile memory cells are coupled to a second program line;

current terminals of the read transistors of the first and third nonvolatile memory cells are coupled to a first bit line;

current terminals of the read transistors of the second and fourth nonvolatile memory cells are coupled to a second bit line;

current terminals of the first, second, third, and fourth nonvolatile memory cells are coupled to a $V_{SS}$ terminal or the ground terminal; and programming the first nonvolatile memory cell by flowing current through the antifuse component and the switch and bypassing the current away from the read transistor, wherein programming the first nonvolatile memory cell is performed without significantly causing a program disturb with the second, third, and fourth nonvolatile memory cells.

16. The method of claim 15, wherein, during programming, a first voltage difference between the first word line, and the second word line is a programming voltage.

17. The method of claim 16, wherein during programming, a second voltage difference between the second program line and the first program line is less than the programming voltage and is greater than a third voltage difference between the first program line and the first bit line or the second bit line.

18. The method of claim 16, wherein during programming, a second voltage difference between the first access line and the second access line is approximately $V_{DD}$.

* * * * *